United States Patent [19]

Lindstrom

[11] Patent Number: 5,440,611
[45] Date of Patent: Aug. 8, 1995

[54] METHOD OF DETERMINING THE PHYSICAL LENGTH OF A TELEPHONE LINE

[75] Inventor: Anders O. Lindstrom, Vallinby, Sweden

[73] Assignee: Telefonaktiebolaget LM Ericsson, Stockholm, Sweden

[21] Appl. No.: 99,665

[22] Filed: Jul. 30, 1993

[30] Foreign Application Priority Data

Aug. 7, 1992 [SE] Sweden .............................. 9202311

[51] Int. Cl.⁶ .............................................. H04M 1/24
[52] U.S. Cl. ........................................ 379/24; 364/562
[58] Field of Search ................ 364/550, 561, 562; 379/22, 24, 26, 30, 401, 402

[56] References Cited

U.S. PATENT DOCUMENTS

| | | | |
|---|---|---|---|
| 4,083,039 | 4/1978 | Simon | 340/533 |
| 4,734,637 | 3/1988 | Chen et al. | |
| 4,751,724 | 6/1988 | Amadio et al. | 379/24 |

FOREIGN PATENT DOCUMENTS

| | | |
|---|---|---|
| 60-138401A | 7/1985 | Japan . |
| 348560 | 9/1972 | Sweden . |
| 2154742A | 9/1985 | United Kingdom . |

OTHER PUBLICATIONS

Gunnar Bjurel, André Dudnik and Royne Hjortendal, "Development of Line Circuits for AXE 10", *Ericsson Review*, No. 4, pp. 181–185 (1983).

*Primary Examiner*—Emanuel T. Voeltz
*Assistant Examiner*—Edward Pipala
*Attorney, Agent, or Firm*—Burns, Doane, Swecker & Mathis

[57] ABSTRACT

A method for determining the length of a telephone line from an exchange to a subscriber. The method is based on the availability in the exchange of so-called line circuits, each having a given amplification factor G for the signal transmitted from a given subscriber through the line, this factor being stored and made available to the microprocessor of the line circuit card. The attenuation for each unit of line length D between the exchange and the subscriber is known. Since these magnitudes are known, the line length L is calculated in the microprocessor from the equation $L = k \cdot G/D$, where k is a constant which is calculated for a given determined length, amplification factor and attenuation/length unit.

8 Claims, 1 Drawing Sheet

METHOD OF DETERMINING THE PHYSICAL LENGTH OF A TELEPHONE LINE

BACKGROUND

The present invention relates to a method of determining the length of a line, more specifically the length of a telephone line between a subscriber station and an exchange of a telephone system.

In some applications, it is important to know the length of a telephone line between a connected subscriber apparatus and the exchange of a telephone station.

When measuring electric conductors or lines, it is generally known to measure the length of the transmission line by arranging or installing special equipment which is intended solely for measuring the length of the line.

For instance, JP-A-60 138401 teaches the use of special equipment for measuring the absolute length of a transmission line, by providing a phase measuring instrument for signals delivered to the line whose length is to be measured. A measurement of the length of the line can be obtained, by counting the number of times that a test signal passed through the line has exceeded two (2).

Methods are also known which use special bridge circuits and different designs of such bridge circuits for the purpose of measuring the length of a conductor, see for instance SE-B-348 560.

A common feature of these earlier known arrangements and methods thus resides in the necessity of taking more or less complicated measures in carrying out the intended measuring procedure, which can result in expensive and complicated handling procedures.

SUMMARY

The present invention is intended for application in telephone systems of the kind which include so-called line circuits in the telephone system exchange. A line circuit is used generally to transmit analogue signals which correspond to the digital signals connected in a digital exchange and to receive analogue signals from a subscriber, and convert these signals to corresponding digital signals for through-connection in the exchange. The line circuit thus converts the digital signals arriving from the exchange, and amplifies the signals and transmits analogue signals to the intended subscriber. The analogue signals received from a given subscriber are converted and adapted to the digital exchange. The fundamental functions of the line circuit are described, for instance, in ERICSSON REVIEW No. 4, 1983, pages 181-185, in particular, which is expressly incorporated here by reference.

The inventive method comprises the novel features of enabling the length of the line between an exchange and a given subscriber to be determined with the aid of the amplification factor that is already found in the line circuit and which is determined or calculated in said circuit for the incoming line signal from a given subscriber. In order to be able to calculate the length of a line, it is also necessary to know the typical attenuation of the line for each meter of the line and the line circuit amplification at a given length. Thus, those values of the line circuit amplification that are already stored in the microprocessor of the line circuit board for each of the subscribers are used to calculate the line length to respective subscribers. Measuring accuracy is dependent on the process variations of the line circuit and also in the smallest step in the amplification factor, although the accuracy achieved should be sufficient for the majority of applications.

The main advantage afforded by the use of the line circuit for length-determining purposes is that any selected line can be measured without needing to use external equipment, as is necessary in the case with the aforesaid known arrangements.

The object of the present invention is thus to provide a method of measuring the line length between two nodes in a telephone system, by using the properties and parameters of a given unit which is already included in one of these nodes. The invention relates particularly to measuring the line length between an exchange and a subscriber of the telephone system, with the aid of the properties of the subscriber line circuit included in the exchange.

BRIEF DESCRIPTION OF THE DRAWINGS

The invention will now be described in more detail with reference to the accompanying drawings, in which.

DETAILED DESCRIPTION

Figure 1:
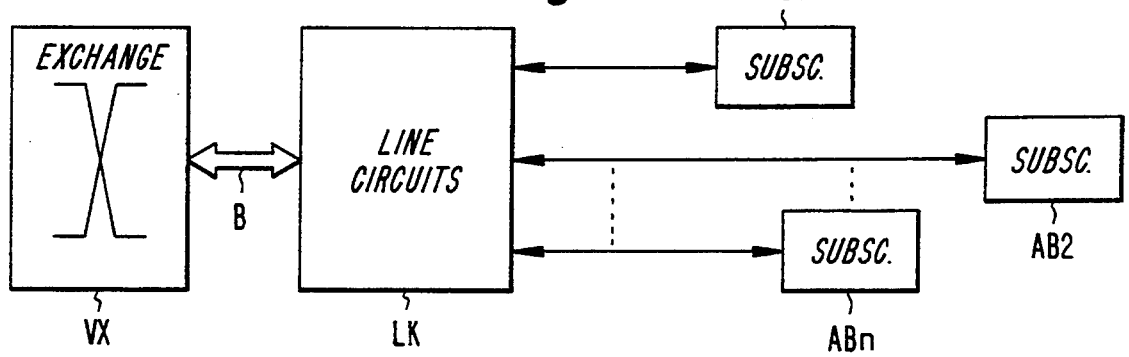
FIG. 1 is a block diagram of an exchange, line circuit board and a number of subscribers.

FIG. 1 is a block diagram of a telephone station which includes an exchange VX, for instance a private branch exchange PABX and a line circuit board LK belonging to the exchange. The outgoing lines from the exchange VX to the subscriber side (to the right of the Figure) are connected by a bus B to the line circuit board LK, which includes, among other things, a number of line circuits which will be described in more detail herebelow with reference to FIG. 3. Digital time multiplexed PCM-signals are delivered from the exchange over the bus to the various subscribers AB1-ABn via the line circuits, while conversely analogue signals from the subscribers AB1-Abn are delivered to the exchange VX in the form of time multiplexed signals. The inventive method is intended to enable the length of each of the lines to subscribers AB1-Abn to be measured, taken from the line circuit board LK to respective subscribers.

Figure 2:
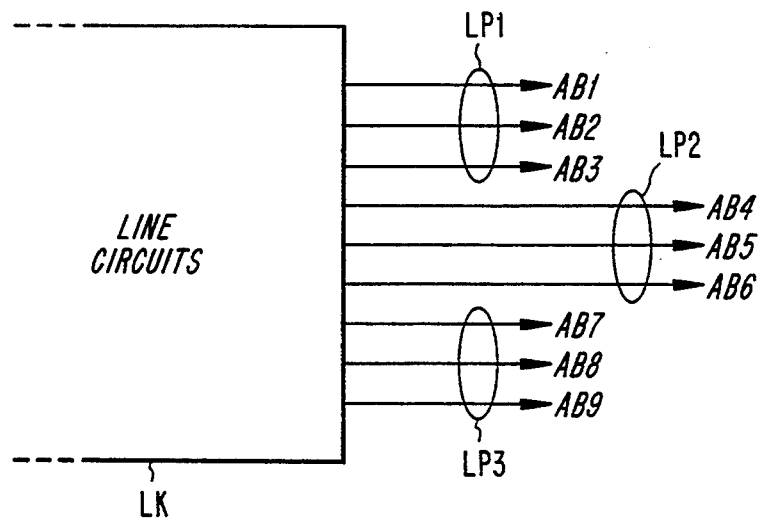
FIG. 2 illustrates a number of outgoing lines from the line circuit board illustrated in FIG. 1.
Figure 3:
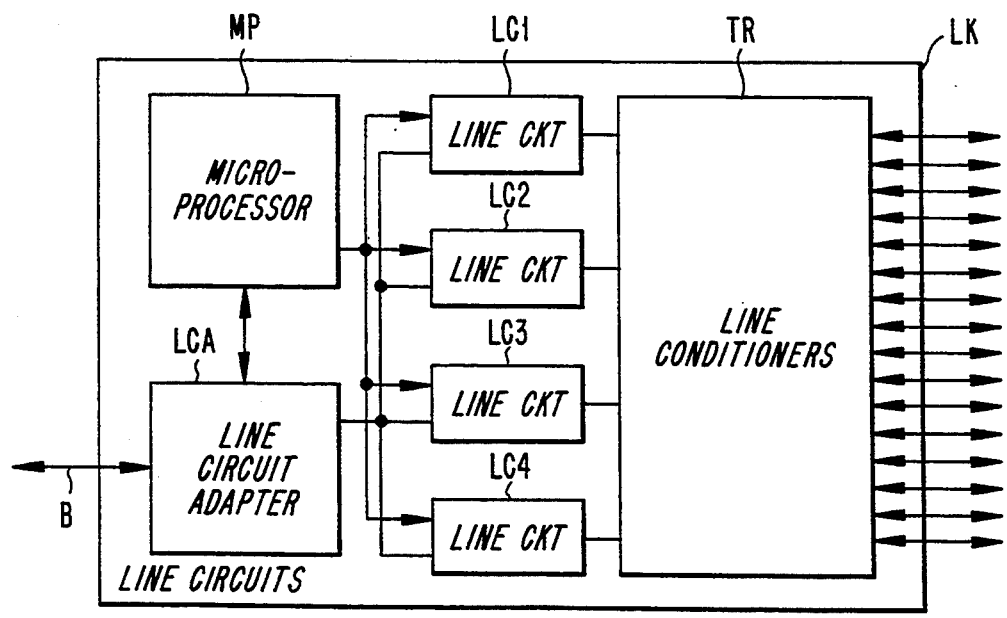
FIG. 3 is a more detailed view of a circuit included in the line circuit board shown in FIGS. 1 and 2 and in which the inventive method is applied.

FIG. 2 is intended to show line groupings to the various subscribers AB1-Abn with different attenuation per line length. It is assumed that the line group LP1 to subscribers AB1-AB3 has a given attenuation value D1 per length unit. The group LP2 is assumed to have another value D2, and the group LP3 a third attenuation value D3 per length unit. FIG. 3 illustrates schematically the known construction of the digital line circuit board.

The bus B from the exchange VX is connected to a line circuit adapter comprised, among other things, of a demultiplexor which demultiplexes the time multiplexed PCM-signals from a trunk line (not shown) to each of the line circuits, in the illustrated case four line circuits LC1-LC4. The incoming PCM-signals can be put through to desired or intended line circuits LC, with the aid of a control register provided in respective line circuits. The register of a given line circuit will therewith determine which time slot in the incoming PCM-signal shall be received and processed in just this line circuit. Respective time slots are written into each of the control registers by a microprocessor MP.

The incoming time multiplexed PCM-signals arriving at the adapter LCA are divided in the multiplexor so that each of the incoming PCM-words belonging to a given call, i.e. to a given subscriber AB1–Abn, is delivered to a given line circuit. Each line circuit has two opposed signal paths for respective signals from and to the subscribers. Among other things, signals passing from the left to the right in FIG. 3 are subjected to digital-analogue conversion in one signal path. Those signals which arrive from a given subscriber and which are thereafter multiplexed with the subscriber signals from remaining line circuits are subjected to analogue-digital conversion in the other signal path, i.e. from the right to the left in FIG. 3, and the resultant time multiplexed PCM-signal is delivered to the exchange VX. These two signal paths are not necessarily physically separated wires, but can be time-division multiplex (two different time slots) over a two-wire connection. Each of the line circuits amplifies the analogue signals incoming from subscribers AB1–Abn to some extent, this amplification being referenced G1 for the line circuit LC1, G2 for the line circuit LC2, and so on.

The block TR represents line conditioning devices including hybrid transformers, filters and overvoltage protectors OVP for the total 16 outgoing lines.

As before mentioned, the line circuit board includes a microprocessor MP which controls the various functions of the line circuit board, i.e. the line circuit adapter LCA and the functions of the line circuits LC1–LC4. The microprocessor stores the value of the attenuating factors D1–D3 of the different lines in accordance with the above and the amplification factors G1–G4 of the line circuits LC1–LC4.

Assume that in the telephone system one wishes to measure the length of a given line to a given subscriber ABj. The system then orders the microprocessor MP to retrieve the value of the attenuation/length unit Dj for the category of conductors to which the line belongs. The measuring process takes place during or after the establishment of a connection and the microprocessor MP thus knows which line circuit has been used for precisely this connection. It is assumed here that line circuit LC2 has been used. The microprocessor MP can retrieve the amplification value G2 of the line circuit LC2. The calculation is then carried out in the processor MP in accordance with the equation:

$L = k \cdot G/D$, where $k$ = constant calculated for a given length, $D = D2$ attenuation/length unit and $G = G2$ amplification factor.

The constant k can be calculated by inserting the values of a given known line length and the known values of the attenuation D and the amplification factor G in the equation $L = k \cdot G/D$. It is assumed that the same value of k applies for all subsequent line length calculations. Thus, a given line length Lo is measured and determined. The characteristic attenuation Do for a given line can be obtained from tables, and the amplification factor Go is determined for a given type of line circuit and can be read from an internal register. The amplification factor Go may be stored, for instance, in the internal read-write memory (RAM) of the microprocessor MP.

The line circuit amplification factors G for those subscribers served by the line circuit concerned are written into and stored in a register which is common to all subscribers, or alternatively in an individual register for respective subscribers in the line circuit, and are read from the line circuit register and written into and stored in the RAM of the microprocessor MP when calculating the length of the line to a given subscriber. When another type of line circuit is used, or when more than one type of line circuit is used in the line circuit board, it is necessary to carry out two or more measuring processes in order to determine the constant k belonging to a given type of line circuit. Furthermore, it is necessary to perform several measuring processes when more than one type of conductor is used, as illustrated in FIG. 2.

The described method of determining the length of a line with the aid of the line circuit amplification factor and line attenuation presumes that the transmitting side, i.e. the subscriber, transmits its signal at a constant level. This requirement is fulfilled in general, since the level of the transmitted signal is not varied in the transmitting line circuit, independent on the line length.

The inventive method involves the use of parameters which are already available and which can be readily stored in a processor, which also carries out the requisite calculations. The novel features of the proposed method reside in the use of the amplification factor in the line circuit concerned to calculate the length of a line. This enables the length of any line whatsoever to be measured without the use of external apparatus and without incurring any extra cost in general.

The line length can be determined by the microprocessor MP on the line circuit board LK in the aforedescribed manner, or can be calculated somewhere else on the basis of the obtained values of the attenuation/length unit and amplification factor.

What is claimed is:

1. A method for determining a physical length L of a line between a first node and a second node in a telephone system, the second node including a subscriber line circuit for communicating line signals between the first node and the second node, comprising the steps of:
    retrieving from a memory an attenuation D db per unit length of the line;
    retrieving from a memory the subscriber line circuit's amplification factor G dB for the line signals communicated on the line; and
    determining the physical length L based on the attenuation D and the amplification factor G and predetermined circuit properties of the second node.

2. A method according to claim 1, wherein the determining steps are carried out in a data processor in the subscriber line circuit.

3. A method according to claim 2, wherein the amplification factor G varies for line signals to different line circuits in the second node, such that a first amplification factor G1 corresponds to a first line circuit and a second amplification factor G2 corresponds to a second line circuit in said second node, and the method further comprises the steps of storing the amplification factors G1 and G2 in the second node and retrieving from the memory the amplification factors G1 and G2, the physical lengths corresponding to the first line circuit and the second line circuit being determined based on the respective retrieved amplification factors.

4. A method according to claim 1, further comprising the step of storing an attenuation D in the second node for a given type of conductor between the first and second node.

5. An apparatus for measuring a physical length L of a line between a first node and a second node in a telephone system, the apparatus comprising:
   a memory for storing an attenuation D dB per unit length of the line and an amplification factor G dB for line signals communicated on the line; and
   a microprocessor for determining the physical length L of the line based on the attenuation D and the amplification factor G stored in the memory and predetermined circuit properties of the second node.

6. The apparatus of claim 5, wherein the amplification factor G varies for line signals to different line circuits in the second node, such that a first amplification factor G1 corresponds to a first line circuit and a second amplification factor G2 corresponds to a second line circuit in the second node, the physical lengths corresponding to the first line circuit and the second line circuit being determined based on the respective amplification factors.

7. An apparatus for measuring a physical length of a line between a first node and a second node in a telephone system, the apparatus comprising:
   a subscriber line circuit in the second node for communicating line signals between the first node and the second node and for amplifying incoming signals from a subscriber;
   a memory for storing an amplification factor of the subscriber line circuit and for storing an attenuation per unit length value of the line, the attenuation per unit length value being measured during or after the establishment of a call connection; and
   a microprocessor for determining a length of the line based on the amplification factor and the attenuation per unit length value stored in the memory.

8. The apparatus of claim 7, wherein the amplification factor varies for line signals to different line circuits in the second node, such that a first amplification factor corresponds to a first line circuit and a second amplification factor corresponds to a second line circuit in the second node, the physical lengths corresponding to the first line circuit and the second line circuit being determined based on the respective amplification factors.

* * * * *